United States Patent
Park et al.

(10) Patent No.: US 12,101,976 B2
(45) Date of Patent: Sep. 24, 2024

(54) ELECTRONIC DEVICE

(71) Applicant: Samsung Display Co., Ltd., Yongin-si (KR)

(72) Inventors: Junhyun Park, Suwon-si (KR); Jangmi Kang, Seoul (KR); Minjae Jeong, Hwaseong-si (KR)

(73) Assignee: SAMSUNG DISPLAY CO., LTD., Gyeonggi-do (KR)

(*) Notice: Subject to any disclaimer, the term of this patent is extended or adjusted under 35 U.S.C. 154(b) by 391 days.

(21) Appl. No.: 17/685,773

(22) Filed: Mar. 3, 2022

(65) Prior Publication Data

US 2022/0352291 A1 Nov. 3, 2022

(30) Foreign Application Priority Data

Apr. 28, 2021 (KR) .................. 10-2021-0054720

(51) Int. Cl.
*H10K 59/131* (2023.01)
*H10K 59/126* (2023.01)

(52) U.S. Cl.
CPC ......... *H10K 59/131* (2023.02); *H10K 59/126* (2023.02)

(58) Field of Classification Search
CPC .. H10K 59/131; H10K 59/126; G09G 3/3233; G09G 3/3208; G09G 2300/0426; G09G 2330/021; H01L 27/124
See application file for complete search history.

(56) References Cited

U.S. PATENT DOCUMENTS

| | | | |
|---|---|---|---|
| 10,789,890 B2* | 9/2020 | Kang | G09G 3/3233 |
| 10,803,802 B2 | 10/2020 | Song et al. | |
| 2021/0359066 A1* | 11/2021 | An | H01L 27/124 |
| 2022/0102463 A1* | 3/2022 | Park | H10K 59/80515 |
| 2023/0180521 A1* | 6/2023 | Cheng | H10K 59/1213 |
| | | | 257/40 |

FOREIGN PATENT DOCUMENTS

| | | |
|---|---|---|
| KR | 1020190143549 A | 12/2019 |
| KR | 1020200005695 A | 1/2020 |

* cited by examiner

*Primary Examiner* — J. E. Schoenholtz
(74) *Attorney, Agent, or Firm* — CANTOR COLBURN LLP (57) ABSTRACT

An electronic device includes a display panel including a plurality of pixels. Each of the plurality of pixels includes a light-emitting diode, a power line, an initialization voltage line, an initialization signal line, a bias voltage line, a transistor including a first gate in contact with the initialization signal line through a first contact and electrically connected between the initialization voltage line and the anode, and a transistor including a second gate in contact with the initialization signal line through a second contact and electrically connected between the power line and the bias voltage line. In a plan view, the initialization signal line does not overlap the power line.

20 Claims, 9 Drawing Sheets

ELECTRONIC DEVICE

This application claims priority to Korean Patent Application No. 10-2021-0054720, filed on Apr. 28, 2021, and all the benefits accruing therefrom under 35 U.S.C. § 119, the content of which in its entirety is herein incorporated by reference.

BACKGROUND

1. Field

Embodiments of the invention herein relate to an electronic device which prevents the degradation in display quality.

2. Description of the Related Art

Various display devices used in electronic devices such as a television, a mobile phone, a tablet computer, a navigation system, a game machine are being developed. Particularly, since portable electronic devices are operated by batteries, various efforts are being made to reduce power consumption.

One of the efforts to reduce the power consumption is to lower an operation frequency of a display device. When the operation frequency of the display device is lowered in a specific operation environment such as displaying a still image, the power consumption of the display device may be reduced.

There is a demand for a technology for reducing the power consumption of the display device, while preventing display quality degradation.

SUMMARY

Embodiments of the invention provide an electronic device which prevents display quality degradation for each operation frequency.

An embodiment of the invention provides an electronic device including a display panel including a plurality of pixels, where each of the plurality of pixels includes a light-emitting diode, a power line which receives a power voltage, an initialization voltage line which receives an initialization voltage, an initialization signal line which receives an initialization signal, a bias voltage line which receives a bias voltage, a first transistor electrically connected between the power line and an anode of the light-emitting diode, a second transistor electrically connected between a data line and a first reference node, a third transistor including a first gate in contact with the initialization signal line through a first contact and electrically connected between the initialization voltage line and the anode, and a fourth transistor including a second gate in contact with the initialization signal line through a second contact different from the first contact and electrically connected between the power line and the bias voltage line, where in a plan view, the initialization signal line may not overlap the power line.

In an embodiment, the initialization signal line may be extended in a first direction, and the power line may be extended in a second direction crossing the first direction.

In an embodiment, a first capacitor electrically connected between the power line and the first reference node and a second capacitor electrically connected between the first reference node and a second reference node may be further included.

In an embodiment, the first transistor may include a source connected to the power line and a gate connected to the second reference node.

In an embodiment, the second transistor may include a gate which receives a data write signal, a source connected to the data line, and a drain connected to the first reference node.

In an embodiment, a width of the initialization signal line along a direction perpendicular to a main extension direction of the initialization signal line may be larger than a width of the bias voltage line along the direction perpendicular to the main extension direction of the initialization signal line.

In an embodiment, the first gate and the second gate may be integrated, and the second gate may be extended in a main extension direction of the initialization signal line from the first gate.

In an embodiment, the power line may include a first power line portion overlapping the first gate and the second gate in the plan view and a second power line portion non-overlapping the first gate and the second gate, and a first width of the first power line portion along a direction perpendicular to a main extension direction of the power line may be smaller than a second width of the second power line portion along the direction perpendicular to the main extension direction of the power line.

In an embodiment, in the plan view, at least one of the first gate and the second gate may overlap the power line.

In an embodiment, the initialization signal line may include a first initialization signal line and a second initialization signal line spaced apart in a main extension direction of the initialization signal line from the first initialization signal line, where the first initialization signal line may contact the first gate through the first contact, and the second initialization signal line may contact the second gate through the second contact.

In an embodiment, the first initialization signal line and the second initialization signal line may be electrically connected through the first gate and the second gate.

In an embodiment, the third transistor and the fourth transistor may be turned on in response to the initialization signal.

In an embodiment, a fifth transistor electrically connected between the first transistor and a second reference node, a sixth transistor electrically connected between the initialization voltage line and the second reference node, a seventh transistor electrically connected between a reference power line to which a reference voltage is applied and the first reference node, an eighth transistor electrically connected between the first transistor and the anode, and a ninth transistor electrically connected between the power line and the fourth transistor may be further included.

In an embodiment of the invention, an electronic device includes a display panel having a plurality of pixels, where each of the plurality of pixels includes a light-emitting diode, a power line which receives a power voltage, an initialization signal line which receives an initialization signal, an initialization voltage line which receives an initialization voltage, a bias voltage line which receives a bias voltage, a first transistor electrically connected between the power line and an anode of the light-emitting diode, a second transistor electrically connected between a data line and a first reference node, a third transistor including a first gate in contact with the initialization signal line through a first contact and electrically connected between the initialization voltage line and the anode, and a fourth transistor including a second gate in contact with the initialization signal line through a second contact different from the first contact and electrically connected between the power line and the bias voltage line, where the initialization signal line may include a first line portion overlapping the power line and a second line portion non-overlapping the power line in a plan view, and a first width of the first line portion along a direction perpendicular to a main extension direction of the initialization signal line may be smaller than a second width of the second line portion along the direction perpendicular to the main extension direction of the initialization signal line.

In an embodiment, a width of the bias voltage line along the direction perpendicular to the main extension direction of the initialization signal line may be larger than the first width but smaller than the second width.

In an embodiment, the initialization signal line may be extended in a first direction, and the power line may be extended in a second direction crossing the first direction.

In an embodiment, the power line may include a first power line portion overlapping the initialization signal line and a second power line portion non-overlapping the initialization signal line, and a first width of the first power line portion along a direction perpendicular to a main extension direction of the power line may be smaller than a second width of the second power line portion along the direction perpendicular to the main extension direction of the power line.

In an embodiment, the first gate and the second gate may be provided integrated, and the second gate may be extended in the main extension direction of the initialization signal line from the first gate.

In an embodiment, in the plan view, at least one of the first gate and the second gate may overlap the power line.

In an embodiment, the third transistor and the fourth transistor may be turned on in response to the initialization signal.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain principles of the invention. In the drawings.

DETAILED DESCRIPTION

In the disclosure, when an element (or a region, a layer, a portion, or the like) is also referred to as being "on," "connected to," or "coupled to" another element, it means that the element may be directly disposed on/connected to/coupled to the other element, or that a third element may be disposed therebetween.

Like reference numerals refer to like elements. Also, in the drawings, the thickness, the ratio, and the dimensions of elements are exaggerated for an effective description of technical contents. The term "and/or," includes all combinations of one or more of which associated components may define.

It will be understood that, although the terms "first", "second", etc. may be used herein to describe various elements, these elements should not be limited by these terms. These terms are only used to distinguish one element from another. For example, a first element may be referred to as a second element, and a second element may also be referred to as a first element in a similar manner without departing the scope of rights of the invention. The terms of a singular form may include plural forms unless the context clearly indicates otherwise.

In addition, terms such as "below," "lower," "above," "upper," and the like are used to describe the relationship of the components shown in the drawings. The terms are used as a relative concept and are described with reference to the direction indicated in the drawings.

It should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which the invention pertains. It is also to be understood that terms such as terms defined in commonly used dictionaries should be interpreted as having meanings consistent with the meanings in the context of the related art, and should not be interpreted in too ideal a sense or an overly formal sense unless explicitly defined herein. A term such as "unit" may mean a hardware component such as a circuit block which performs a predetermined function, for example.

Hereinafter, embodiments of the invention will be described with reference to the accompanying drawings.

Figure 1:
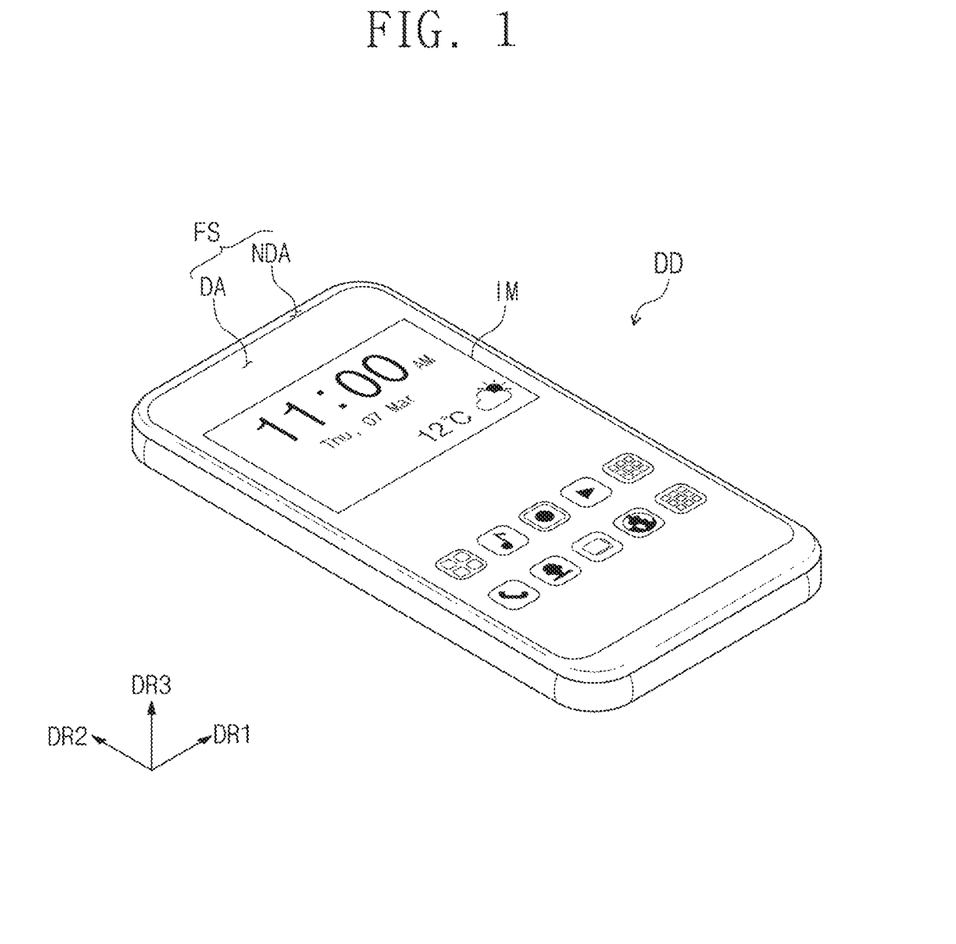
FIG. 1 is a perspective view of an embodiment of an electronic device according to the invention.

FIG. 1 is a perspective view of an embodiment of an electronic device according to the invention.

Referring to FIG. 1, an electronic device DD may have a shape which has short sides extending in a first direction DR1 and longs sides extending in a second direction DR2 which crosses the first direction DR1. However, the shape of the electronic device DD is not limited thereto. The electronic device DD of various shapes may be provided.

The electronic device DD according to the invention may be a large-sized electronic device such as a television and a monitor, and may be a small-and-medium-sized electronic device such as a mobile phone, a tablet computer, a car navigation system unit, and a game console. It should be understood that these are merely embodiments, and the electronic device DD may be employed in other electronic devices as long as it does not depart from the scope of the invention.

As illustrated in FIG. 1, the electronic device DD may display an image IM toward a third direction DR3, which crosses the first direction DR1 and the second direction DR2, on a display surface FS parallel to each of the first direction DR1 and the second direction DR2. That is, the third direction DR3 may be normal to a plane defined by the first direction DR1 and the second direction DR2. The display surface FS on which the image IM is displayed may correspond to a front surface of the electronic device DD. However, the invention is not limited thereto, and other surfaces of the electronic device DD may also display an image.

The display surface FS of the electronic device DD may be divided into a plurality of regions. The display surface FS of the electronic device DD may have a display region DA and a non-display region NDA.

The display region DA may be a region in which the image IM is displayed, and a user may visually recognize the image IM through the display region DA. The shape of the display region DA may substantially be defined by the non-display region NDA. However, the invention is not limited thereto. The non-display region NDA may be disposed adjacent to only one side of the display region DA, or may be omitted. The electronic device DD in an embodiment of the invention may include various embodiments, and is not limited to any particular embodiment.

The non-display region NDA is a region adjacent to the display region DA, and may be a region in which the image IM is not displayed. A bezel region of the electronic device DD may be defined by the non-display region NDA.

The non-display region NDA may surround the display region DA. However, the invention is not limited thereto. The non-display region NDA may be adjacent only to a portion of the edge of the display region DA, and is not limited to any particular embodiment.

Figure 2:
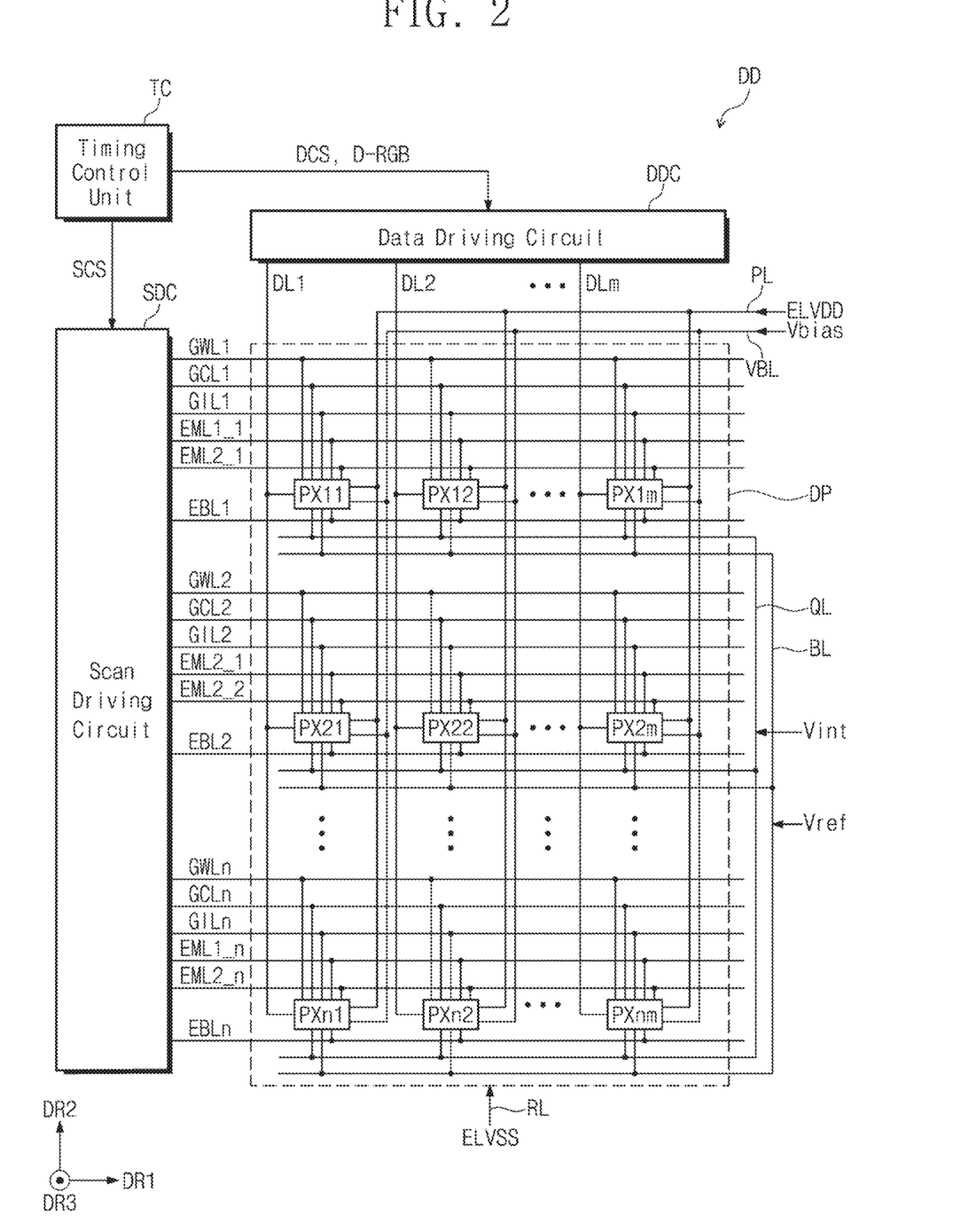
FIG. 2 is a block diagram of an embodiment of an electronic device according to the invention.

FIG. 2 is a block diagram of an embodiment of an electronic device according to the invention.

Referring to FIG. 2, the electronic device DD may include a timing control unit TC, a scan driving circuit SDC, a data driving circuit DDC, and a display panel DP.

The display panel DP in an embodiment of the invention may be a light-emitting type display panel, but is not particularly limited thereto. In an embodiment, the display panel DP may be an organic light-emitting display panel, an inorganic light-emitting display panel, a micro-light-emitting diode display panel, or a nano-light-emitting diode display panel. A light-emitting layer of the organic light-emitting display panel may include an organic light-emitting material. In an embodiment, a light-emitting layer of the inorganic light-emitting display panel may include a quantum dot, a quantum load, or the like. In an embodiment, a light-emitting layer of the micro-light-emitting diode display panel may include a micro-light-emitting diode. In an embodiment, a light-emitting layer of the nano-light-emitting diode display panel may include a nano-light-emitting diode. Hereinafter, the display panel DP may be described as an organic light-emitting display panel.

The timing control unit TC may receive image signals and a control signal from the outside. The timing control unit TC may convert the data format of the input image signals to meet interface specifications with the data driving circuit DDC to generate image data D-RGB. The timing control unit TC may convert the control signal to generate a scan control signal SCS and a data control signal DCS. The timing control unit TC may output the image data D-RGB, the data control signal DCS, and the scan control signal SCS.

The scan driving circuit SDC may receive the scan control signal SCS from the timing control unit TC. The scan control signal SCS may include a vertical start signal which starts the operation of the scan driving circuit SDC, a clock signal which determines the output timing of signals, or the like. The scan driving circuit SDC may generate a plurality of scan signals, a plurality of compensation scan signals, and a plurality of initialization scan signals. The scan driving circuit SDC may output the scan signals to corresponding data write lines GWL1 to GWLn, may output the compensation scan signals to corresponding compensation scan lines GCL1 to GCLn, and may output the initialization scan signals to corresponding initialization scan signal lines GIL1 to GILn. Here, n is a natural number. In addition, the scan driving circuit SDC may generate a plurality of light emission signals and a plurality of initialization signals in response to the scan control signal SCS. The scan driving circuit SDC may output the light emission signals to corresponding first light emission signal lines EML1_1 to EML1_$n$ and corresponding second light emission signal lines EML2_1 to EML2_$n$, and may output the initialization signals to corresponding initialization signal lines EBL1 to EBLn.

In FIG. 1, scan signals, compensation scan signals, and initialization scan signals, and light emission signals and initialization signals are illustrated as being output from one scan driving circuit SDC, but the invention is not limited thereto. In an embodiment of the invention, the electronic device DD may include a plurality of scan driving circuits SDC. Each of a plurality of scan driving signals may output scan signals, compensation scan signals, initialization scan signals, light emission signals, and initialization signals. In addition, in an embodiment of the invention, the scan driving circuit SDC may include a driving circuit which generates and outputs scan signals, compensation scan signals, and initialization scan signals, and a driving circuit which generates and outputs light emission signals and initialization signals.

The data driving circuit DDC may receive the data control signal DCS and the image data D-RGB from the timing control unit TC. The data driving circuit DDC may convert the image data D-RGB to data voltages, and may output the data voltages to a plurality of data lines DL1 to DLm (m is a natural number) to be described later. The data voltages may be analog voltages corresponding to gray scale values of the image data D-RGB.

The display panel DP may include the data write lines GWL1 to GWLn, the compensation scan lines GCL1 to GCLn, the initialization scan lines GIL1 to GILn, the first light emission signal lines EML1_1 to EML1_$n$, the second light emission signal lines EML2_1 to EML2_$n$, the initialization signal lines EBL1 to EBLn, the data lines DL1 to DLm, a power line PL, an initialization voltage line QL, a bias voltage line VBL, a common voltage line RL, and a plurality of pixels PX11 to PXnm. The data write lines GWL1 to GWLn, the compensation scan lines GCL1 to GCLn, the initialization scan lines GIL1 to GILn, the first light emission signal lines EML1_1 to EML1_$n$, the second light emission signal lines EML2_1 to EML2_$n$, the initialization signal lines EBL1 to EBLn may be extended in the first direction DR1, and may be arranged in the second direction DR2 which crosses the first direction DR1.

The data lines DL1 to DLm may cross the data write lines GWL1 to GWLn, the compensation scan lines GCL1 to GCLn, the initialization scan lines GIL1 to GILn, the first light emission signal lines EML1_1 to EML1_$n$, the second light emission signal lines EML2_1 to EML2_$n$, and the initialization signal lines EBL1 to EBLn while being insulated therefrom. Each of the plurality of pixels PX11 to PXnm may be connected to corresponding signal lines GWL1 to GWLn, GCL1 to GCLn, and GIL1 to GILn among signal lines GWL1 to GWLn, GCL1 to GCLn, and GIL1 to GILn. The connection relationship between the pixels PX11 to PXnm and the signal lines GWL1 to GWLn, GCL1 to GCLn, and GIL1 to GILn may be changed according to the configuration of a driving circuit of the pixels PX11 to PXnm.

The power line PL may receive a power voltage ELVDD. The initialization power line QL may receive an initialization voltage Vint. The bias voltage line VBL may receive a bias voltage Vbias. A reference voltage line BL may receive a reference voltage Vref. The reference voltage line BL may receive the power voltage ELVDD. The initialization voltage Vint may have a lower level than the power voltage ELVDD. A common voltage ELVSS may be applied to the display panel DP through the common voltage line RL. The common voltage ELVSS may have a lower level than the power voltage ELVDD.

In the above, the electronic device DD in an embodiment has been described with reference to FIG. 2, but the electronic device DD of the invention is not limited thereto. The signal lines GWL1 to GWLn, GCL1 to GCLn, and GIL1 to GILn may be further added to the electronic device DD depending on the configuration of a pixel, or may be omitted. In addition, the connection relationship between each of the pixels PX11 to PXnm and the signal lines GWL1 to GWLn, GCL1 to GCLn, and GIL1 to GILn may be changed.

The plurality of pixels PX11 to PXnm may include a plurality of groups including light-emitting diodes OLEDs (refer to FIG. 3) which generate different color lights. In an embodiment, red pixels which generate red color light, green pixels which generate green color light, and blue pixels which generate blue color light may be included. Each of a light-emitting diode of a red pixel, a light-emitting diode of a green pixel, and a light-emitting diode of a blue pixel may include a light-emitting layer, and the respective light-emitting layers may include different materials from each other.

Each of the plurality of pixels PX11 to PXnm may include a plurality of transistors and at least one capacitor electrically connected to the transistors. At least one of the scan driving circuit SDC and the data driving circuit DDC may include a plurality of transistors formed or provided through the same process as a process for forming a pixel driving circuit.

Through performing a photolithography process a plurality of times, the above-described signal lines GWL1 to GWLn, GCL1 to GCLn, and GIL1 to GILn, the plurality of pixels PX11 to PXnm, the scan driving circuit SDC, and the data driving circuit DDC may be formed or disposed on a base substrate.

Figure 3:
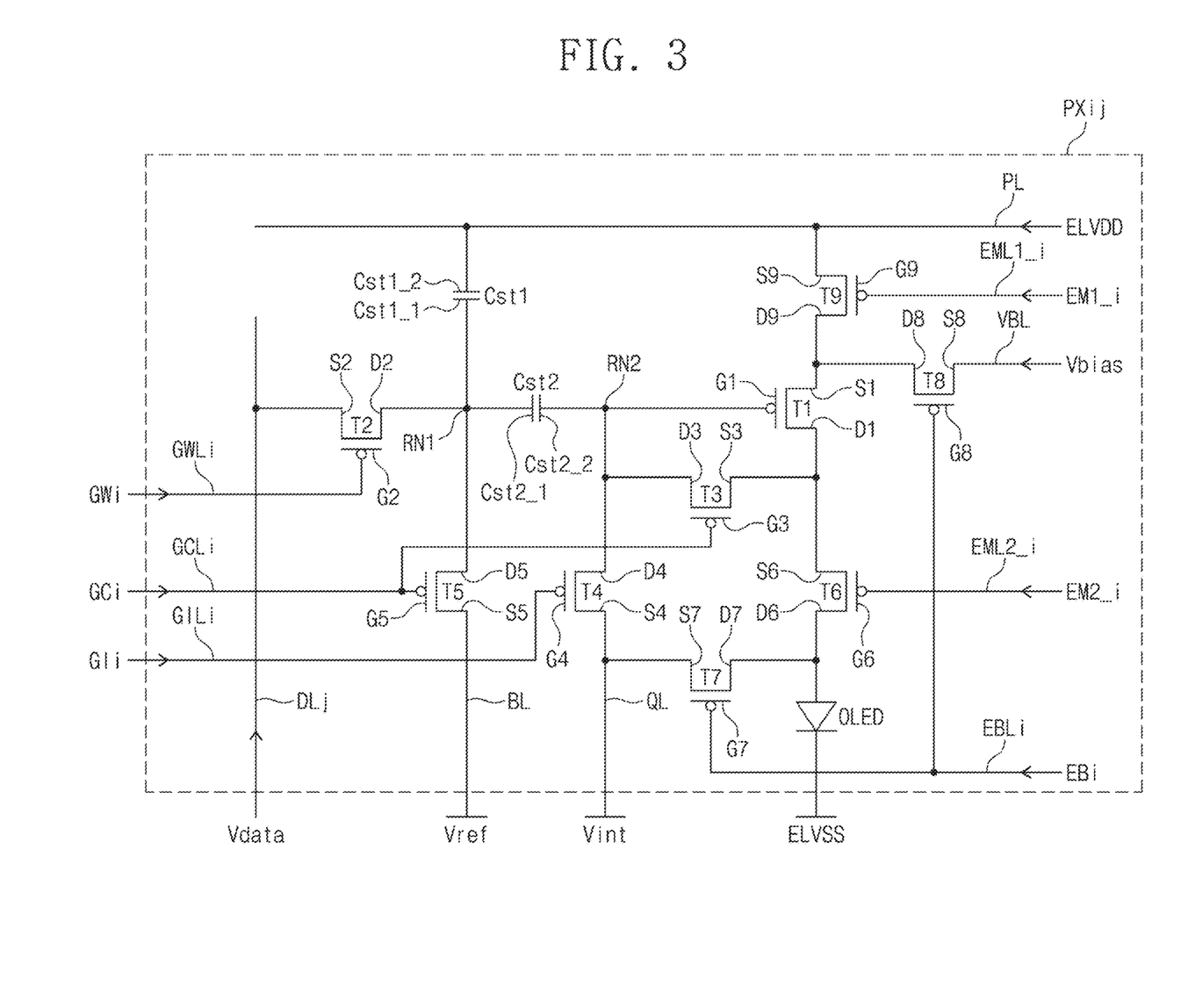
FIG. 3 is an equivalent circuit diagram of an embodiment of a pixel according to the invention.

FIG. 3 is an equivalent circuit diagram of an embodiment of a pixel according to the invention.

Referring to FIG. 3, a pixel PXij connected to an i-th data write line GWLi among data write lines GWL1 to GWLn, and connected to a j-th data line DLj among data lines DL1 to DLm is illustrated. That is, i may be a natural number equal to or less than n and j may be a natural number equal to or less than m.

In the illustrated embodiment, the pixel PXij may include first to ninth transistors T1 to T9, a first capacitor Cst1, a second capacitor Cst2, and a light-emitting diode OLED. In the illustrated embodiment, each of the first to the ninth transistors T1 to T9 is described as a P-type transistor. However, the invention is not limited thereto. Each of the first to the ninth transistors T1 to T9 may be implemented as either a P-type transistor or an N-type transistor. In addition, the number of transistors included in the pixel PXij is not limited thereto. That is, at least one of the first to the ninth transistors T1 to T9 may be omitted, and in addition, as another example, one or more transistors may be added to the pixel PXij.

In the illustrated embodiment, the first transistor T1 may be also referred to as a driving transistor, and the second transistor T2 may be also referred to as a switching transistor.

The first capacitor Cst1 may be electrically connected between a power line PL which receives a power voltage ELVDD and a first reference node RN1. The first capacitor Cst1 may include a first electrode Cst1_1 connected to the first reference node RN1 and a second electrode Cst1_2 connected to the power line PL.

The second capacitor Cst2 may be electrically connected between the first reference node RN1 and a second reference node RN2. The second capacitor Cst2 may include a first electrode Cst2_1 connected to the first reference node RN1 and a second electrode Cst2_2 connected to the second reference node RN2.

The first transistor T1 may be connected between the power line PL and one electrode of the light-emitting diode OLED. The one electrode may be an anode of the light-emitting diode OLED. A source S1 of the first transistor T1 may be electrically connected to the power line PL. In the invention, "being electrically connected between a transistor and a signal line or between a transistor and a transistor" may mean that "a source, a drain, and a gate of the transistor have a one body shape with the signal line, or are connected through a connection electrode." Between the source S1 of the first transistor T1 and the power line PL, another transistor may be disposed or omitted.

A drain D1 of the first transistor T1 may be electrically connected to the anode of the light-emitting diode OLED. A gate G1 of the first transistor T1 may be electrically connected to the second reference node RN2.

The second transistor T2 may be electrically connected between the j-th data line DLj and the first reference node RN1. A source S2 of the second transistor T2 is electrically connected to the j-th data line DLj, and a drain D2 of the second transistor T2 is electrically connected to the first reference node RN1. In the illustrated embodiment, a gate G2 of the second transistor T2 may be electrically connected to the i-th data write line GWLi.

The third transistor T3 may be electrically connected between the drain D1 of the first transistor T1 and the second reference node RN2. A source S3 of the third transistor T3 may be electrically connected to the second reference node RN2, and a drain D3 of the third transistor T3 may be electrically connected to the drain D1 of the first transistor T1. A gate G3 of the third transistor T3 may be electrically connected to an i-th compensation scan line GCLi.

The fourth transistor T4 may be electrically connected between the drain D3 of the third transistor T3 and an initialization voltage line QL. A source S4 of the fourth transistor T4 may be electrically connected to the initialization voltage line QL, and a drain D4 of the fourth transistor T4 may be electrically connected to the drain D3 of the third transistor T3. In an embodiment of the invention, a gate G4 of the fourth transistor T4 may be electrically connected to an i-th initialization scan line GILL However, the invention is not limited thereto. Each of the third transistor T3 and the fourth transistor T4 in an embodiment of the invention may include a plurality of gates connected in series. Since each of the third transistor T3 and the fourth transistor T4 has a plurality of gates, the leakage current of the pixel PXji, which may occur when a transistor is turned off, may be reduced.

The fifth transistor T5 is connected between the first reference node RN1 and a reference voltage line BL. A drain D5 of the fifth transistor T5 is electrically connected to the first reference node RN1, and a source S5 of the fifth transistor T5 is electrically connected to the reference voltage line BL. In the illustrated embodiment, a gate G5 of the fifth transistor T5 may be electrically connected to the i-th compensation scan line GCLi.

While FIG. 3 illustrates that the gate G3 of the third transistor T3 and the gate G5 of the fifth transistor T5 are commonly connected to the i-th compensation scan line GCLi, the invention is not limited thereto. In an embodiment of the invention, the gate G5 of the fifth transistor T5 may be connected to a different signal line other than the gate G3 of the fifth transistor T3.

The sixth transistor T6 may be electrically connected between the drain D1 of the first transistor T1 and the light-emitting diode OLED. A source S6 of the sixth transistor T6 may be electrically connected to the drain D1 of the first transistor T1, and a drain D6 of the sixth transistor T6 may be electrically connected to the anode of the light-emitting diode OLED. In the illustrated embodiment, a gate G6 of the sixth transistor T6 may be electrically connected to an i-th second light emission signal line EML2_i.

The seventh transistor T7 may be electrically connected between the anode of the light-emitting diode OLED and the initialization voltage line QL. A source S7 of the seventh transistor T7 may be electrically connected to the initialization voltage line QL, and a drain D7 of the seventh transistor T7 may be electrically connected to the anode of the light-emitting diode OLED. In the illustrated embodiment, a gate G7 of the seventh transistor T7 may be electrically connected to an i-th initialization signal line EBLi. The seventh transistor T7 may receive an i-th initialization signal EBi.

The eighth transistor T8 may be electrically connected between the source S1 of the first transistor T1 and a bias voltage line VBL. A source S8 of the eighth transistor T8 may be electrically connected to the bias voltage line VBL, and a drain D8 of the eighth transistor T8 may be electrically connected to the source S1 of the first transistor T1. A gate G8 of the eighth transistor T8 may be electrically connected to the i-th initialization signal line EBLi. The eighth transistor T8 may receive the i-th initialization signal EBi.

The ninth transistor T9 may be electrically connected between the power line PL and the source S1 of the first transistor T1. A source S9 of the ninth transistor T9 may be electrically connected to the power line PL, and a drain D9 of the ninth transistor T9 may be electrically connected to the source S1 of the first transistor T1. In the illustrated embodiment, a gate G9 of the ninth transistor T9 may be electrically connected to an i-th first light emission signal line EML1_i.

Figure 4A:
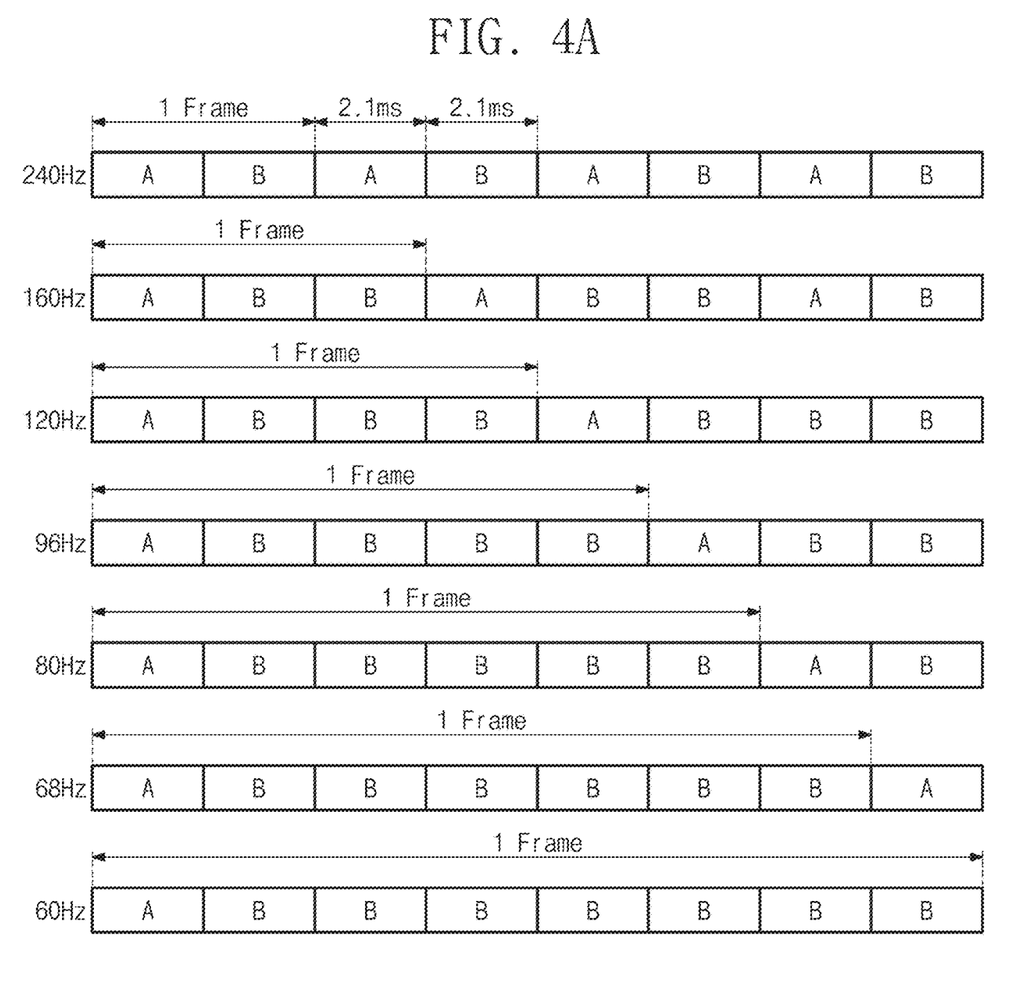
FIG. 4A is a view illustrating an embodiment of driving frequencies according to a driving operation of an electronic device according to the invention.
Figure 4B:
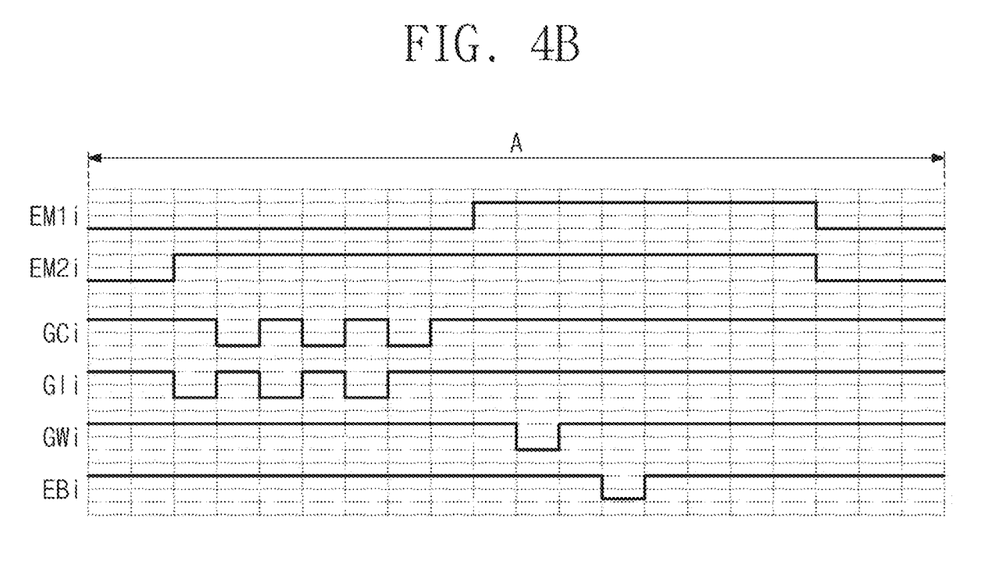
FIG. 4B is a waveform diagram of an embodiment of driving signals in interval A illustrated in FIG. 4A according to the invention.
Figure 4C:
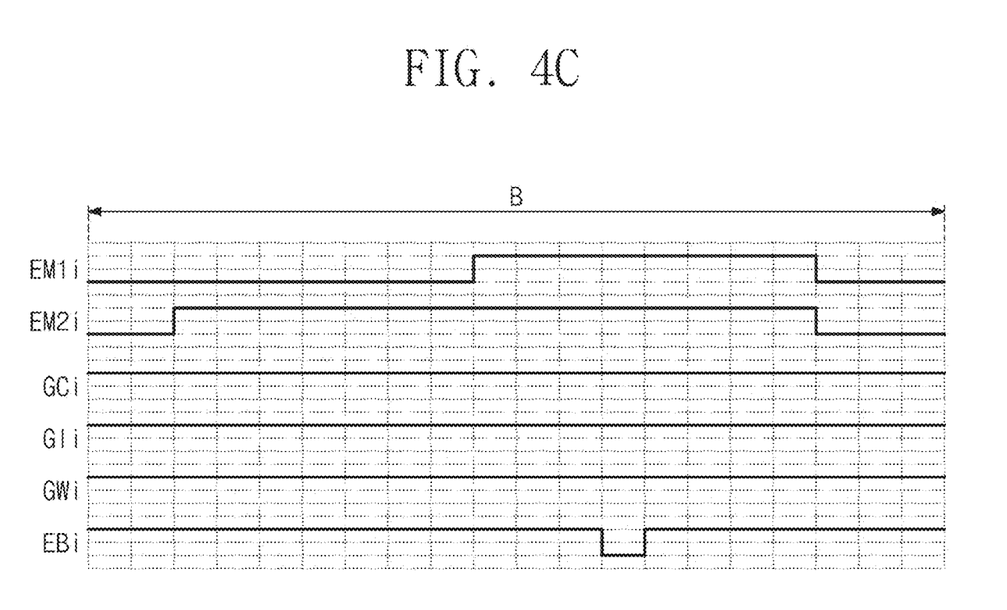
FIG. 4C is a waveform diagram of an embodiment of driving signals in interval B illustrated in FIG. 4A according to the invention.

FIG. 4A is a view illustrating an embodiment of driving frequencies according to a driving operation of an electronic device according to the invention. FIG. 4B is a waveform diagram of an embodiment of driving signals in interval A illustrated in FIG. 4A according to the invention. FIG. 4C is a waveform diagram of an embodiment of driving signals in interval B illustrated in FIG. 4A according to the invention.

Referring to FIG. 2 to FIG. 4C, the electronic device DD may control a driving frequency of the display panel DP through the repetition of the interval B. The electronic device DD may synchronize the frame generation of a graphics processing apparatus included in the electronic device DD and the frame output timing of the display panel DP. That is, the display panel DP may operate at a variable scan rate, and when the operation frequency of a display device is lowered in a predetermined operation environment such as displaying a still image, the power consumption of the electronic device DD may be reduced.

Each of the interval A and the interval B may be an interval having a time of about 2.1 millisecond (ms). That is, each of the interval A and the interval B may have a frequency of about 480 hertz (Hz). However, the invention is not limited thereto. The time of each of the interval A and the interval B is not limited thereto. In an embodiment, each of the interval A and the interval B may be an interval having a time of about 4.2 ms.

When the graphics processing apparatus generates a frame having a scan rate of about 240 Hz, the scan driving circuit SDC may control each of the interval A and the interval B to be driven once in one frame to allow the display panel DP to operate at a frequency of about 240 Hz.

When the graphics processing apparatus generates a frame having a scan rate of about 160 Hz, the scan driving circuit SDC may control the interval A to be driven once and the interval B to be driven twice in one frame to allow the display panel DP to operate at a frequency of about 160 Hz.

When the graphics processing apparatus generates a frame having a scan rate of about 120 Hz, the scan driving circuit SDC may control the interval A to be driven once and the interval B to be driven three times in one frame to allow the display panel DP to operate at a frequency of about 120 Hz.

When the graphics processing apparatus generates a frame having a scan rate of about 96 Hz, the scan driving circuit SDC may control the interval A to be driven once and the interval B to be driven four times in one frame to allow the display panel DP to operate at a frequency of about 96 Hz.

When the graphics processing apparatus generates a frame having a scan rate of about 80 Hz, the scan driving circuit SDC may control the interval A to be driven once and the interval B to be driven five times in one frame to allow the display panel DP to operate at a frequency of about 80 Hz.

When the graphics processing apparatus generates a frame having a scan rate of about 68 Hz, the scan driving circuit SDC may control the interval A to be driven once and the interval B to be driven six times in one frame to allow the display panel DP to operate at a frequency of about 68 Hz.

When the graphics processing apparatus generates a frame having a scan rate of about 60 Hz, the scan driving circuit SDC may control the interval A to be driven once and the interval B to be driven seven times in one frame to allow the display panel DP to operate at a frequency of about 60 Hz. However, the invention is not limited thereto. The scan driving circuit SDC may control the ratio of the interval A and the interval B to allow the display panel DP to operate at various frequencies.

Each of signals EM1_$i$, EM2_$i$, GCi, GIi, GWi, and EBi may have a high level during some intervals, and may have a low level during some intervals. N-type transistors whose gates are electrically connected to signal lines GWL1 to GWLn, GCL1 to GCLn, GBL1 to GBLn, and GIL1 to GILn and first and second light emission signal lines EML1_$i$ and EML2_$i$ may be turned on when a corresponding signal has a high level, and P-type transistors may be turned on when a corresponding signal has a low level.

When a second light emission signal EM2_$i$ of one frame has a high level, an initialization scan signal GIi, which turns on a transistor to which the i-th initialization scan line GILi is electrically connected, may be supplied to the gate of the transistor. When the fourth transistor T4 is turned on by the supply of the initialization scan signal GIi, the initialization voltage Vint may be transmitted to the gate G1 of the first transistor T1 through the fourth transistor T4. Therefore, the second reference node RN2 connected to the gate G1 of the first transistor T1 may be initialized to the initialization voltage Vint.

A compensation scan signal GCi, which turns on a transistor to which the i-th compensation scan line GCLi is electrically connected, may be supplied to the gate of the transistor. When the third transistor T3 and the fifth transistor T5 are turned on by the supply of the compensation scan signal GCi, the first transistor T1 may be connected to the light-emitting diode OLED by the turned-on third transistor T3, and biased in a forward direction. A compensation voltage ELVDD-Vth reduced by a threshold voltage Vth of the first transistor T1 from the power voltage ELVDD supplied from the power line PL may be applied to the gate G1 of the first transistor T1. That is, the voltage of the second reference node RN2 may become the compensation voltage ELVDD-Vth. At the same time, when the fifth transistor T5 is turned on in response to the compensation scan signal GCi, the reference voltage Vref may be transmitted to the drain D2 of the second transistor T2 through the fifth transistor T5. Therefore, the voltage of the first reference node RN1 connected to the drain D2 of the second transistor T2 may be become the reference voltage Vref.

A data write signal GWi, which turns on a transistor to which the i-th data write line GWLi is electrically connected, may be supplied to the gate of the transistor. When the second transistor T2 is turned on by the supply of the data write signal GWi, a data voltage Vdata corresponding to data may be transmitted to the gate D5 of the fifth transistor T5 through second transistor T2. Therefore, the voltage of the first reference node RN1 connected to the drain D5 of the fifth transistor T5 may be become the data voltage Vdata.

To both ends of the first capacitor Cst1, the first power voltage ELVDD and the data voltage Vdata may be applied. In the first capacitor Cst1, electric charges corresponding to a voltage difference between both ends ELVDD-Vdata may be stored.

To both ends of the second capacitor Cst2, the data voltage Vdata and the compensation voltage ELVDD-Vth may be applied. In the second capacitor Cst2, electric charges corresponding to a voltage difference between both ends ELVDD-Vth-Vdata may be stored.

At this time, the voltage of the first reference node RN1 may change from the reference voltage Vref, which is a voltage when the fifth transistor T5 is turned on, to the data voltage Vdata, which is a voltage when the second transistor T2 is turned on. A voltage change amount Vdata-Vref of the first reference node RN1 may be transferred to the second reference node RN2 by the effect of coupling of the second capacitor Cst2. That is, the voltage of the second reference node RN2 may be a value Vdata+ELVDD-Vth-Vref obtained by adding the compensation voltage ELVDD-Vth, which is a voltage when the third transistor T3 is turned on, and the voltage change amount Vdata-Vref of the first reference node RN1 when the second transistor T2 is turned on.

According to the invention, within one frame, the initialization scan signal GIi and the compensation scan signal GCi may include a signal which is repeated several times. Through the several repetition, the initialization scan signal GIi and the compensation scan signal GCi may repeat the voltage initialization of the gate G1 of the first transistor T1 and the application of the compensation voltage ELVDD-Vth to further reduce the influence of previously input data. Therefore, the display panel DP with improved display quality may be provided.

An initialization signal EBi, which turns on a transistor to which the i-th initialization signal line EBLi is electrically connected, may be supplied to the gate of the transistor. The seventh transistor T7 may be turned on by the supply of the initialization signal EBi. The initialization voltage Vint may be supplied to the anode of the light-emitting diode OLED through the seventh transistor T7. By applying the initialization voltage Vint to the anode of the light-emitting diode OLED, it is possible to prevent the light-emitting diode OLED from being instantaneously emitted with a high luminance due to a residual voltage remaining in the anode of the light-emitting diode OLED at the beginning of the drive of the light-emitting diode OLED.

In addition, the eighth transistor T8 may be turned on by the supply of the initialization signal EBi. The bias voltage Vbias may be supplied to the source S1 of the first transistor T1 through the eighth transistor T8.

Unlike the embodiment of the invention, depending on hysteresis properties of the first transistor T1, the driving current of the first transistor T1 by the data voltage Vdata applied in the current frame may be affected by the data voltage Vdata applied in the previous frame. Specifically, even when the data voltage Vdata for displaying an image of a predetermined gray scale is applied in the current frame, when the data voltage Vdata for displaying an image of a predetermined gray scale has been applied in the previous frame, an image having a gray scale higher than the predetermined gray scale may be displayed on the display panel DP. In addition, even when the data voltage Vdata for displaying an image of a predetermined gray scale is applied in the current frame, when the data voltage Vdata for displaying an image of a high gray scale has been applied in the previous frame, an image having a gray scale lower than the predetermined gray scale may be displayed on the display panel DP. Accordingly, in displaying the image IM (refer to FIG. 1) on the display panel DP, the degradation in image quality occurs due to a phenomenon such as flicker, and when the display panel DP is driven at a low frequency, the degradation in image quality may become severe since the time for which the data voltage Vdata of the previous frame is applied to the first transistor T1 gets longer than when the display panel DP is driven at a high frequency. However, according to the invention, the bias voltage Vbias is applied to the source S1 of the first transistor T1 through the eighth transistor T8, so that a luminance deviation due to the hysteresis properties of the first transistor T1 may be reduced. Therefore, the electronic device DD (refer to FIG. 1) in which display quality degradation for each operation frequency is prevented.

A first light emission signal EM1_i, which turns on a transistor to which the i-th first light emission signal line EML1_i is electrically connected, may be supplied to the gate of the transistor. The ninth transistor T9 may be turned on by the supply of the first light emission signal EM1_i.

A second light emission signal EM2_i, which turns on a transistor to which the i-th second light emission signal line EML2_i is electrically connected, may be supplied to the gate of the transistor. The sixth transistor T6 may be turned on by the supply of second light emission signal EM2_i.

A driving current may be generated in accordance with the voltage difference between a gate voltage of the gate G1 of the first transistor T1 and a source voltage of the source S1 thereof. Through the sixth transistor T6 and the ninth transistor T9, the driving current may be supplied to the light-emitting diode OLED to allow a current to flow in the light-emitting diode OLED. A gate-source voltage of the first transistor T1 may be maintained at (Vdata+ELVDD-Vth-Vref)-ELVDD by the second capacitor Cst2, and according to the current-voltage relationship of the first transistor T1, the driving current of the first transistor T1 may be proportional to the square of a value obtained by subtracting the threshold voltage Vth of the first transistor T1 from the gate-source voltage of the first transistor T1. Accordingly, the driving current may be determined regardless of the threshold voltage Vth of the first transistor T1.

Data voltages output from the data driving circuit DDC of the display panel DP are written, and thus, the light-emitting diode OLED may emit light. A frequency at which the data voltages Vdata are written may be also referred to as an operation frequency. A frequency provided with the data write signal GWi for turning on the second transistor T2 electrically connected to the data line DLj in order to write the data voltages Vdata is the same as the operation frequency.

Figure 5A:
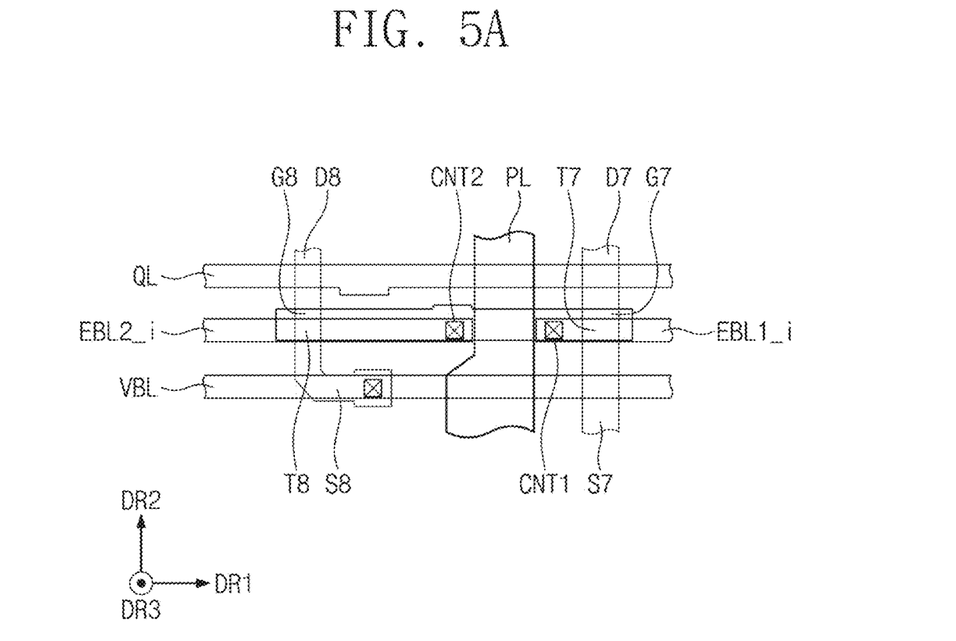
FIG. 5A and FIG. 5B are plan views illustrating an embodiment of a portion of a pixel according the invention.

FIG. 5A is a plan view illustrating an embodiment of a portion of a pixel according to the invention.

FIG. 5A illustrates the seventh transistor T7 and the eighth transistor T8 among the plurality of transistors T1 to T9 of the pixel PXij connected to the i-th data write line GWLi among the plurality of data write lines GWL1 to GWLn, and connected to the j-th data line DLj among the plurality of data lines DL1 to DLm.

Referring to FIG. 3 and FIG. 5A, the initialization signal line EBLi may include a first initialization signal line EBLi_1 and a second initialization signal line EBLi_2. The first initialization signal line EBLi_1 and the second initialization signal line EBLi_2 may be spaced apart in the first direction DR1. Each of the first initialization signal line EBLi_1 and the second initialization signal line EBLi_2 may be extended in the first direction DR1.

The power line PL may be extended in the second direction DR2.

The source S7 of the seventh transistor T7 may be electrically connected to the initialization voltage line QL, and the drain D7 of the seventh transistor T7 may be electrically connected to the anode of the light-emitting diode OLED.

Through a first contact CNT1, the gate G7 of the seventh transistor T7 may contact the first initialization signal line EBLi_1 and be electrically connected thereto.

The source S8 of the eighth transistor T8 may be electrically connected to the bias voltage line VBL, and the drain D8 of the eighth transistor T8 may be electrically connected to the source S1 of the first transistor T1.

Through a second contact CNT2, the gate G8 of the eighth transistor T8 may contact the second initialization signal line EBLi_2 and be electrically connected thereto.

The gate G7 of the seventh transistor T7 and the gate G8 of the eighth transistor T8 may be integrated. The gate G8 of the eighth transistor T8 may be extended in the first direction DR1 from the gate G7 of the seventh transistor T7.

The first initialization signal line EBLi_1 and the second initialization signal line EBLi_2 may be electrically connected through the gate G7 of the seventh transistor T7 and the gate G8 of the eighth transistor T8. Therefore, even when the first initialization signal line EBLi_1 and the second initialization signal line EBLi_2 are spaced apart, the initialization signal EBi may be transmitted.

In a plan view, the first initialization signal line EBLi_1 and the second initialization signal line EBLi_2 may not overlap the power line PL. In a plan view, at least one of the gate G7 of the seventh transistor T7 and the gate G8 of the eighth transistor T8 may overlap the power line PL.

Unlike the embodiment of the invention, load applied to the initialization signal line EBLi may increase, so that the initialization signal EBi be transmitted delayed. In this case, since the initialization signal EBi is not accurately transmitted, the seventh transistor T7 may not supply the initialization voltage Vint to the light-emitting diode OLED, and there may be a region in the display region DA, the region in which the eighth transistor T8 is unable to supply the bias voltage Vbias to the first transistor T1. Therefore, there may be a luminance deviation in the display region DA of the electronic device DD (refer to FIG. 1), which may cause a flicker phenomenon. However, according to the invention, since the initialization signal line EBLi and the power line PL do not overlap each other, capacitance which may occur between the initialization signal line EBLi and the power line PL may be reduced. That is, the load applied to the initialization signal line EBLi may decrease, and the initialization signal EBi may be stably transmitted to the seventh transistor T7 and the eighth transistor T8. The luminance deviation which may be generated in the display region DA (refer to FIG. 1) may be prevented. Therefore, the electronic device DD (refer to FIG. 1) in which display quality degradation is prevented may be provided.

Figure 5B:
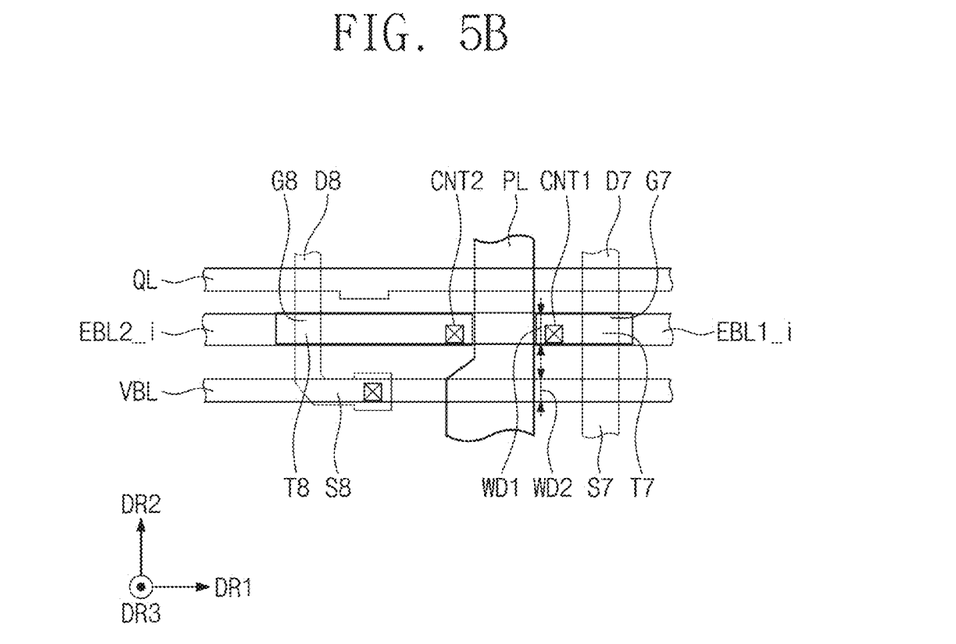

FIG. 5B is a plan view illustrating an embodiment of a portion of a pixel according to the invention. In describing FIG. 5B, the same reference numerals are given to the elements described with reference to FIG. 5A, and the descriptions thereof are omitted.

Referring to FIG. 5B, a width WD1 in the second direction DR2 of each of the first initialization signal line EBLi_1 and the second initialization signal line EBLi_2 may be larger than a width WD2 in the second direction DR2 of the bias voltage line VBL.

Resistance may be reduced by the width WD1 of each of the first initialization signal line EBLi_1 and the second initialization signal line EBLi_2. According to the invention, the load applied to the initialization signal line EBLi may decrease, and the initialization signal EBi may be stably transmitted to the seventh transistor T7 and the eighth transistor T8. The luminance deviation which may be generated in the display region DA (refer to FIG. 1) may be prevented. Therefore, the electronic device DD (refer to FIG. 1) in which display quality degradation is prevented may be provided.

Figure 6:
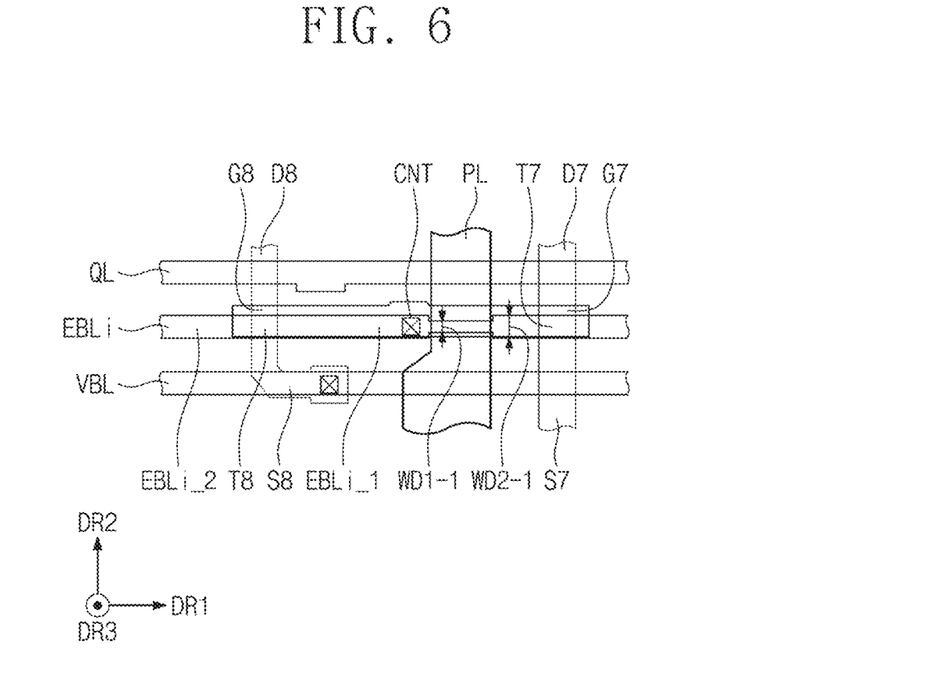
FIG. 6 is a plan view illustrating a portion of an embodiment of a pixel according to the invention.

FIG. 6 is a plan view illustrating an embodiment of a portion of a pixel according to the invention.

Referring to FIG. 3 and FIG. 6, the initialization signal line EBLi may be extended in the first direction DR1. The power line PL may be extended in the second direction DR2.

The source S7 of the seventh transistor T7 may be electrically connected to the initialization voltage line QL, and the drain D7 of the seventh transistor T7 may be electrically connected to the anode of the light-emitting diode OLED.

The source S8 of the eighth transistor T8 may be electrically connected to the bias voltage line VBL, and the drain D8 of the eighth transistor T8 may be electrically connected to the source S1 of the first transistor T1.

Through a contact CNT, the gate G7 of the seventh transistor T7 and the gate G8 of the eighth transistor T8 may contact the initialization signal line EBLi and be electrically connected thereto.

The initialization signal line EBLi may include a first line portion EBLi_1 overlapping the power line PL in a plan view, and a second line portion EBLi_2 non-overlapping the power line PL thereon.

The second line portion EBLi_2 may be extended in the first direction DR1 from the first line portion EBLi_1.

The gate G7 of the seventh transistor T7 and the gate G8 of the eighth transistor T8 may be integrated. The gate G8 of the eighth transistor T8 may be extended in the first direction DR1 from the gate G7 of the seventh transistor T7.

A width WD1-1 of the first line portion EBLi_1 in the second direction DR2 may be smaller than a width WD2-1 of the second line portion EBLi_2 in the second direction DR2.

Capacitance which may occur between the initialization signal line EBLi and the power line PL may be reduced by the width WD1-1 of the first line portion EBLi_1 in the second direction DR2 overlapping the power line PL. In addition, resistance of the initialization signal line EBLi may be reduced by the width WD2-1 of the second line portion EBLi_2 in the second direction DR2.

According to the invention, the load applied to the initialization signal line EBLi may decrease, and the initialization signal EBi may be stably transmitted to the seventh transistor T7 and the eighth transistor T8. The luminance deviation which may be generated in the display region DA (refer to FIG. 1) may be prevented. Therefore, the electronic device DD (refer to FIG. 1) in which display quality degradation is prevented may be provided.

Figure 7:
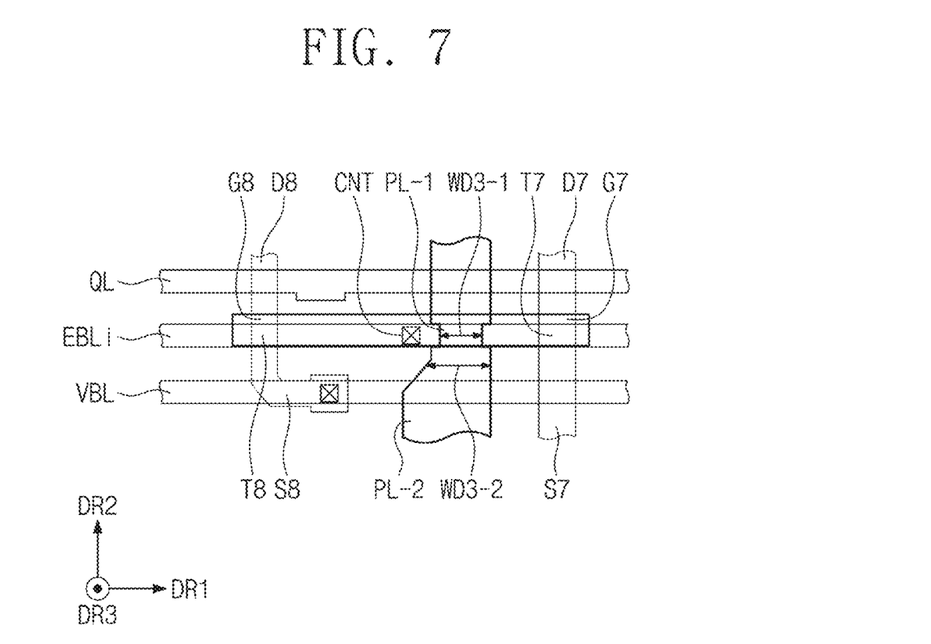
FIG. 7 is a plan view illustrating an embodiment of a portion of a pixel according to the invention.

FIG. 7 is a plan view illustrating an embodiment of a portion of a pixel according to the invention. In describing FIG. 7, the same reference numerals are given to the elements described with reference to FIG. 5A, and the descriptions thereof are omitted.

Referring to FIG. 3 and FIG. 7, the initialization signal line EBLi may be extended in the first direction DR1. The power line PL may be extended in the second direction DR2.

The power line PL may include a first power line portion PL-1 overlapping the initialization signal line EBLi in a plan view, and a second power line portion PL-2 non-overlapping the initialization signal line EBLi.

In a plan view, the first power line portion PL-1 may overlap the gate G7 of the seventh transistor T7 and the gate G8 of the eighth transistor T8. The second power line portion PL-2 may not overlap the gate G7 of the seventh transistor T7 and the gate G8 of the eighth transistor T8.

The second power line portion PL-2 may be extended in the second direction DR2 from the first power line portion PL-1.

A width WD3-1 of the first power line portion PL-1 in the first direction DR1 may be smaller than a width WD3-2 of the second power line portion PL-2 in the first direction DR1.

In a plan view, capacitance which may occur between the initialization signal line EBLi and the power line PL may be reduced by the width WD3-1 of the first power line portion PL-1 in the first direction DR1 overlapping the initialization signal line EBLi.

According to the invention, the load applied to the initialization signal line EBLi may decrease, and the initialization signal EBi may be stably transmitted to the seventh transistor T7 and the eighth transistor T8. The luminance deviation which may be generated in the display region DA (refer to FIG. 1) may be prevented. Therefore, the electronic device DD (refer to FIG. 1) in which display quality degradation is prevented may be provided.

Figure 8A:
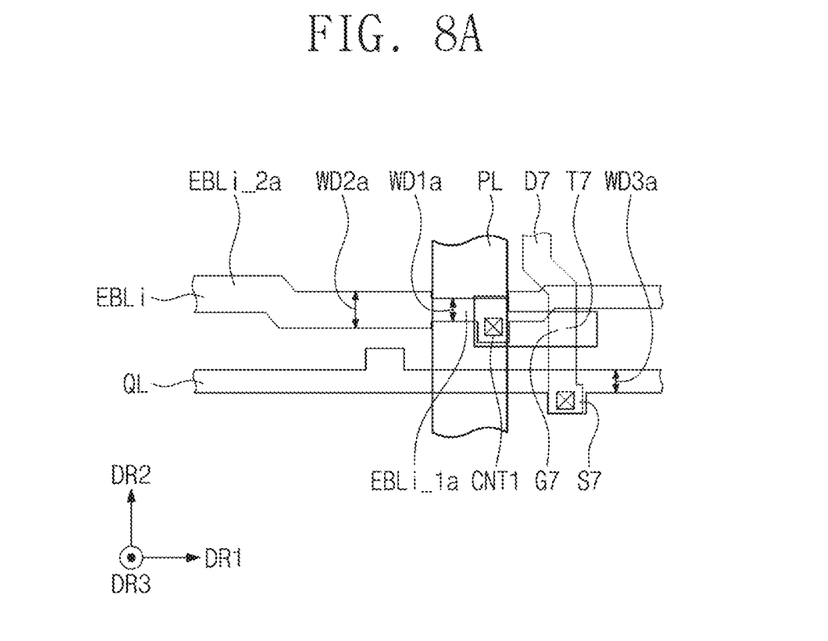
FIG. 8A and FIG. 8B are plan views illustrating an embodiment of a portion of a pixel according to the invention.
Figure 8B:
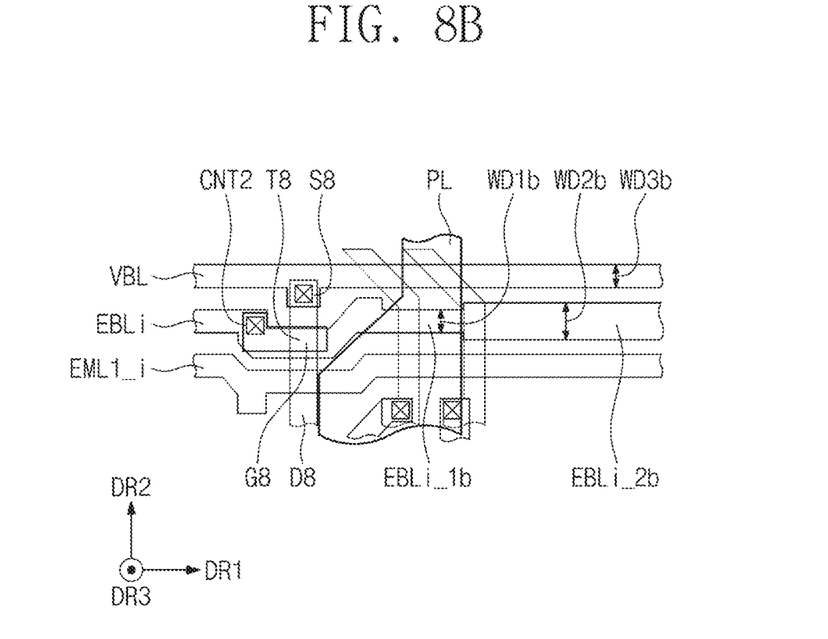

FIG. 8A and FIG. 8B are plan views illustrating an embodiment of a portion of a pixel according to the invention.

FIG. 8A and FIG. 8B illustrate the seventh transistor T7 and the eighth transistor T8 among the plurality of transistors T1 to T9 of the pixel PXij connected to the i-th data write line GWLi among the plurality of data write lines GWL1 to GWLn, and connected to the j-th data line DLj among the plurality of data lines DL1 to DLm.

Referring to FIG. 3, FIG. 8A, and FIG. 8B, the initialization signal line EBLi may be extended in the first direction DR1. The initialization signal line EBLi may be provided in plural. A plurality of the initialization signal lines EBLi may be disposed in different regions of a pixel and may each be electrically connected to the seventh transistor T7 and the eighth transistor T8. The power line PL may be extended in the second direction DR2.

The source S7 of the seventh transistor T7 may be electrically connected to the initialization voltage line QL, and the drain D7 of the seventh transistor T7 may be electrically connected to the anode of the light-emitting diode OLED.

Through the first contact CNT1, the gate G7 of the seventh transistor T7 may contact the initialization signal line EBLi and be electrically connected thereto.

The initialization signal line EBLi may include a first line portion EBLi_1a overlapping the power line PL in a plan view, and a second line portion EBLi_2a non-overlapping the power line PL thereon.

The second line portion EBLi_2a may be extended in the first direction DR1 from the first line portion EBLi_1a.

A width WD1a of the first line portion EBLi_1a in the second direction DR2 may be smaller than a width WD2a of the second line portion EB2a_i in the second direction DR2. A width WD3a of the initialization voltage line QL in the second direction DR2 may be larger than the width WD1a of the first line portion EBLi_1a in the second direction DR2, and may be smaller than the width WD2a of the second line portion EBLi_2a in the second direction DR2.

Capacitance which may occur between the initialization signal line EBLi and the power line PL may be reduced by the width WD1a of the first line portion EBLi_1a in the second direction DR2 overlapping the power line PL. In addition, resistance of the initialization signal line EBLi may be reduced by the width WD2a of the second line portion EBLi_2a in the second direction DR2.

According to the invention, the load applied to the initialization signal line EBLi may decrease, and the initialization signal EBi may be stably transmitted to the seventh transistor T7. The luminance deviation which may be generated in the display region DA (refer to FIG. 1) may be prevented. Therefore, the electronic device DD (refer to FIG. 1) in which display quality degradation is prevented may be provided.

The source S8 of the eighth transistor T8 may be electrically connected to the bias voltage line VBL, and the drain D8 of the eighth transistor T8 may be electrically connected to the source S1 of the first transistor T1.

Through the second contact CNT2, the gate G8 of the eighth transistor T8 may contact the initialization signal line EBLi and be electrically connected thereto.

The initialization signal line EBLi may include a first line portion EBLi_1b overlapping the power line PL in a plan view, and a second line portion EBLi_2b non-overlapping the power line PL thereon.

The second line portion EBLi_2b may be extended in the first direction DR1 from the first line portion EBLi_1b.

A width WD1b of the first line portion EBLi_1b in the second direction DR2 may be smaller than a width WD2b of the second line portion EBLi_2b in the second direction DR2. A width WD3b of the bias voltage line VBL in the second direction DR2 may be larger than the width WD1b of the first line portion EBLi_1b in the second direction DR2, and may be smaller than the width WD2b of the second line portion EBLi_2b in the second direction DR2.

Capacitance which may occur between the initialization signal line EBLi and the power line PL may be reduced by the width WD1b of the first line portion EBLi_1b in the second direction DR2 overlapping the power line PL. In addition, resistance of the initialization signal line EBLi may be reduced by the width WD2b of the second line portion EBLi_2b in the second direction DR2.

According to the invention, the load applied to the initialization signal line EBLi may decrease, and the initialization signal EBi may be stably transmitted to the eighth transistor T8. The luminance deviation which may be generated in the display region DA (refer to FIG. 1) may be prevented. Therefore, the electronic device DD (refer to FIG. 1) in which display quality degradation is prevented may be provided.

Figure 9A:
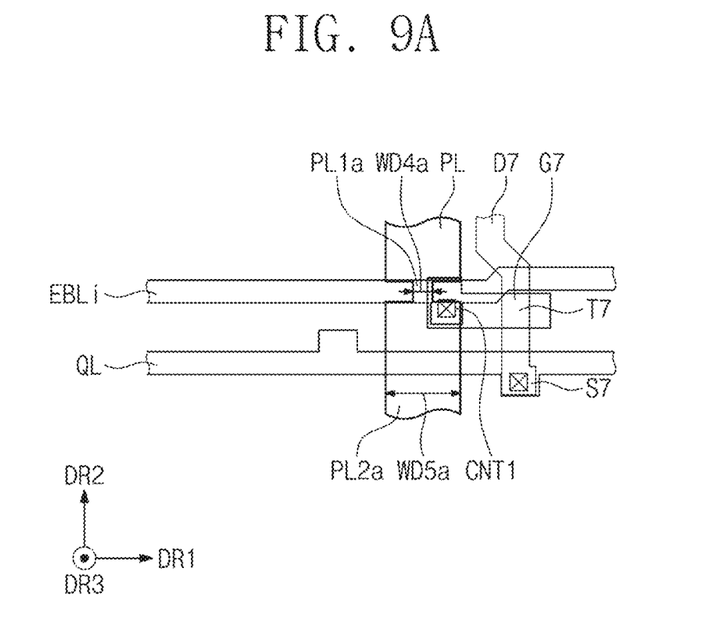
FIG. 9A to FIG. 9B are plan views illustrating an embodiment of a portion of a pixel according to the invention.
Figure 9B:
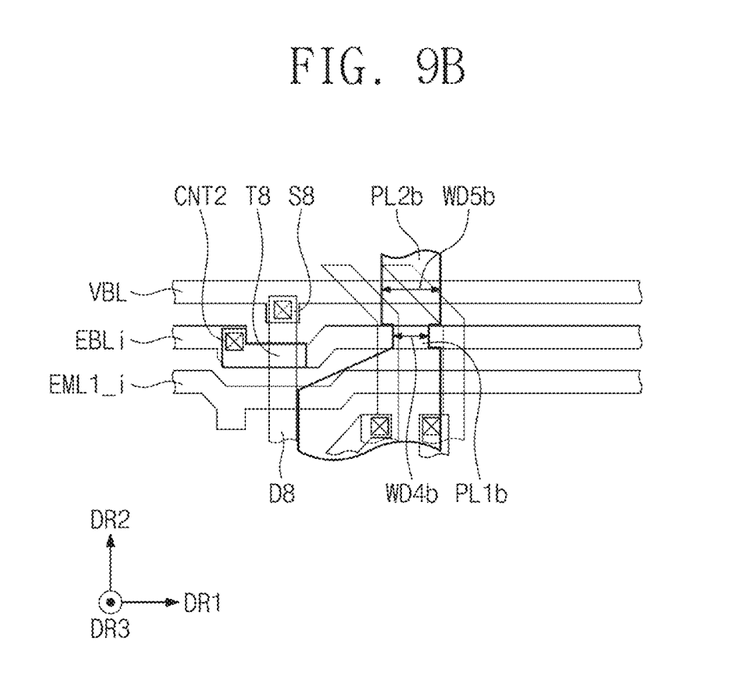

FIG. 9A to FIG. 9B are plan views illustrating an embodiment of a portion of a pixel according to the invention. In describing FIG. 9A and FIG. 9B, the same reference numerals are given to the elements described with reference to FIG. 8A and FIG. 8B, and the descriptions thereof are omitted.

Referring to FIG. 3, FIG. 9A, and FIG. 9B, the initialization signal line EBLi may be extended in the first direction DR1. The initialization signal line EBLi may be provided in plural. The power line PL may be extended in the second direction DR2.

The power line PL may include first power line portions PL1a and PL1b each overlapping the plurality of the initialization signal lines EBLi in a plan view, and second power line portions PL2a and PL2b non-overlapping the initialization signal line EBLi.

A second power line portion PL2a may be extended in the second direction DR2 from a first power line portion PL1a. A second power line portion PL2b may be extended in the second direction DR2 from a first power line portion PL1b.

A width WD4a of the first power line portion PL1a in the first direction DR1 may be smaller than a width WD5a of the second power line portion PL2a in the first direction DR1.

A width WD4b of the first power line portion PL1b in the first direction DR1 may be smaller than a width WD5b of the second power line portion PL2b in the first direction DR1.

In a plan view, capacitance which may occur between the initialization signal line EBLi and the power line PL may be reduced by the widths WD4a and WD4b of the first power line portions PL1a and PL1b in the first direction DR1 overlapping the initialization signal line EBLi.

According to the invention, the load applied to the initialization signal line EBLi may decrease, and the initialization signal EBi may be stably transmitted to the seventh transistor T7 and the eighth transistor T8. The luminance deviation which may be generated in the display region DA (refer to FIG. 1) may be prevented. Therefore, the electronic device DD (refer to FIG. 1) in which display quality degradation is prevented may be provided.

As described above, load applied to an initialization signal line may decrease, and an initialization signal may be stably transmitted to corresponding transistors. A bias voltage may be supplied through the initialization signal to a driving transistor, so that a luminance deviation due to hysteresis properties of the driving transistor may be reduced, and an initialization voltage may be supplied through the initialization signal to a light-emitting diode, so that a luminance deviation due to a residual voltage of the light-emitting diode may be prevented. A luminance deviation which may be generated in a display region of an electronic device may be prevented. Therefore, an electronic device in which display quality degradation is prevented may be provided.

Although the invention has been described with reference to preferred embodiments of the invention, it will be understood by those skilled in the art that various modifications and changes in form and details may be made therein without departing from the spirit and scope of the invention as set forth in the following claims. Accordingly, the technical scope of the invention is not intended to be limited to the contents set forth in the detailed description of the specification, but is intended to be defined by the appended claims.

What is claimed is:

1. An electronic device comprising a display panel including a plurality of pixels, each of the plurality of pixels including:
   a light-emitting diode including an anode;
   a power line which receives a power voltage;
   an initialization voltage line which receives an initialization voltage;
   an initialization signal line which receives an initialization signal;
   a bias voltage line which receives a bias voltage;
   a first transistor electrically connected between the power line and the anode of the light-emitting diode;
   a second transistor electrically connected between a data line and a first reference node;
   a third transistor including a first gate in contact with the initialization signal line through a first contact and electrically connected between the initialization voltage line and the anode; and
   a fourth transistor including a second gate in contact with the initialization signal line through a second contact different from the first contact and electrically connected between the power line and the bias voltage line,
   wherein in a plan view, the initialization signal line does not overlap the power line.

2. The electronic device of claim 1, wherein the initialization signal line is extended in a first direction, and the power line is extended in a second direction crossing the first direction.

3. The electronic device of claim 2, wherein the initialization voltage line is extended in the first direction.

4. The electronic device of claim 3, wherein a width of the initialization voltage line along the second direction is larger than a width of the bias voltage line along the second direction.

5. The electronic device of claim 2, wherein in the plan view, the first contact and the second contact are spaced apart from each other in the first direction.

6. The electronic device of claim 1, wherein a width of the initialization signal line along a direction perpendicular to a main extension direction of the initialization signal line is larger than a width of the bias voltage line along the direction perpendicular to the main extension direction of the initialization signal line.

7. The electronic device of claim 1, wherein the first gate and the second gate are integrated, and the second gate is extended in a main extension direction of the initialization signal line from the first gate.

8. The electronic device of claim 1, wherein the power line comprises a first power line portion overlapping the first gate and the second gate in the plan view and a second power line portion non-overlapping the first gate and the second gate, and a first width of the first power line portion along a direction perpendicular to a main extension direction of the power line is smaller than a second width of the second power line portion along the direction perpendicular to the main extension direction of the power line.

9. The electronic device of claim 1, wherein in the plan view, at least one of the first gate and the second gate overlaps the power line.

10. The electronic device of claim 1, wherein the initialization signal line comprises a first initialization signal line and a second initialization signal line spaced apart in a main extension direction of the initialization signal line from the first initialization signal line, wherein:
the first initialization signal line contacts the first gate through the first contact; and
the second initialization signal line contacts the second gate through the second contact.

11. The electronic device of claim 10, wherein the first initialization signal line and the second initialization signal line are electrically connected through the first gate and the second gate.

12. The electronic device of claim 1, wherein the third transistor and the fourth transistor are turned on in response to the initialization signal.

13. The electronic device of claim 1, further comprising:
a fifth transistor electrically connected between the first transistor and a second reference node;
a sixth transistor electrically connected between the initialization voltage line and the second reference node;
a seventh transistor electrically connected between a reference power line to which a reference voltage is applied and the first reference node;
an eighth transistor electrically connected between the first transistor and the anode; and
a ninth transistor electrically connected between the power line and the fourth transistor.

14. An electronic device comprising a display panel including a plurality of pixels, each of the plurality of pixels including:
a light-emitting diode including an anode;
a power line which receives a power voltage;
an initialization signal line which receives an initialization signal and includes:
a first line portion overlapping the power line in a plan view; and
a second line portion non-overlapping the power line in the plan view;
an initialization voltage line which receives an initialization voltage;
a bias voltage line which receives a bias voltage;
a first transistor electrically connected between the power line and the anode of the light-emitting diode;
a second transistor electrically connected between a data line and a first reference node;
a third transistor including a first gate in contact with the initialization signal line through a first contact and electrically connected between the initialization voltage line and the anode; and
a fourth transistor including a second gate in contact with the initialization signal line through a second contact different from the first contact and electrically connected between the power line and the bias voltage line,
wherein:
a first width of the first line portion along a direction perpendicular to a main extension direction of the initialization signal line is smaller than a second width of the second line portion along the direction perpendicular to the main extension direction of the initialization signal line.

15. The electronic device of claim 14, wherein a width of the bias voltage line along the direction perpendicular to the main extension direction of the initialization signal line is larger than the first width but smaller than the second width.

16. The electronic device of claim 14, wherein the initialization signal line is extended in a first direction, and the power line is extended in a second direction crossing the first direction.

17. The electronic device of claim 14, wherein the power line comprises a first power line portion overlapping the initialization signal line and a second power line portion non-overlapping the initialization signal line, and a first width of the first power line portion along a direction perpendicular to a main extension direction of the power line is smaller than a second width of the second power line portion along the direction perpendicular to the main extension direction of the power line.

18. The electronic device of claim 14, wherein the first gate and the second gate are integrated, and the second gate is extended in the main extension direction of the initialization signal line from the first gate.

19. The electronic device of claim 14, wherein in the plan view, at least one of the first gate and the second gate overlaps the power line.

20. The electronic device of claim 14, wherein the third transistor and the fourth transistor are turned on in response to the initialization signal.

* * * * *